(12) United States Patent
Nebel

(10) Patent No.: US 9,799,493 B2
(45) Date of Patent: Oct. 24, 2017

(54) ELECTRICAL TRANSFORMER

(71) Applicant: Tibbar Plasma Technologies, Inc., Los Alamos, NM (US)

(72) Inventor: Richard A. Nebel, Los Alamos, NM (US)

(*) Notice: Subject to any disclaimer, the term of this patent is extended or adjusted under 35 U.S.C. 154(b) by 0 days.

(21) Appl. No.: 14/648,014

(22) PCT Filed: Oct. 7, 2013

(86) PCT No.: PCT/US2013/063689
§ 371 (c)(1),
(2) Date: May 28, 2015

(87) PCT Pub. No.: WO2014/084963
PCT Pub. Date: Jun. 5, 2014

(65) Prior Publication Data
US 2015/0294842 A1 Oct. 15, 2015

Related U.S. Application Data

(60) Provisional application No. 61/730,800, filed on Nov. 28, 2012.

(51) Int. Cl.
*H01J 37/32* (2006.01)

(52) U.S. Cl.
CPC .. *H01J 37/32541* (2013.01); *H01J 37/32027* (2013.01); *H01J 37/32532* (2013.01)

(58) Field of Classification Search
None
See application file for complete search history.

(56) References Cited

U.S. PATENT DOCUMENTS

| | | | | |
|---|---|---|---|---|
| 3,530,334 A | * | 9/1970 | Harrington | H05H 1/30 315/111.31 |
| 4,041,353 A | * | 8/1977 | Penfold | H01J 37/3402 204/192.12 |
| 4,347,419 A | * | 8/1982 | Jasper, Jr. | H01J 23/12 219/121.47 |
| 5,476,501 A | * | 12/1995 | Stewart | B29C 59/142 604/265 |
| 6,396,213 B1 | * | 5/2002 | Koloc | H05H 1/04 313/231.31 |
| 6,614,135 B1 | * | 9/2003 | Clapham | F41H 13/0093 250/503.1 |
| 7,232,985 B2 | * | 6/2007 | Monkhorst | G21B 1/00 250/214 R |
| 7,411,353 B1 | * | 8/2008 | Rutberg | H05H 1/44 315/111.21 |
| 7,482,607 B2 | * | 1/2009 | Lerner | G21B 3/00 250/423 R |
| 7,511,246 B2 | * | 3/2009 | Morrisroe | G01N 21/73 118/723 I |
| 7,808,353 B1 | * | 10/2010 | Eskridge | F03H 1/0081 313/341 |
| 8,031,824 B2 | * | 10/2011 | Bystriskii | G21B 1/052 376/107 |

(Continued)

*Primary Examiner* — Douglas W Owens
*Assistant Examiner* — Srinivas Sathiraju

(57) ABSTRACT

Systems and methods for managing electric power are disclosed. In an aspect, a system can comprise plasma disposed in a housing and a pair of helical electrodes disposed in the housing, wherein an electric current passing through the pair of electrodes induces a rotation in the plasma.

19 Claims, 13 Drawing Sheets

(56) References Cited

U.S. PATENT DOCUMENTS

| | | | | |
|---|---|---|---|---|
| 8,289,512 | B2* | 10/2012 | Morrisroe | F23C 99/003 219/121.48 |
| 8,537,958 | B2* | 9/2013 | Laberge | H05H 1/16 376/100 |
| 8,622,735 | B2* | 1/2014 | Morrisroe | F23C 99/001 219/121.36 |
| 8,878,434 | B2* | 11/2014 | Gilbert | H05H 1/46 315/111.21 |
| 9,028,656 | B2* | 5/2015 | Koo | A61C 19/06 204/164 |
| 2010/0202580 | A1* | 8/2010 | Park | H05H 6/00 376/108 |
| 2011/0272386 | A1* | 11/2011 | Morrisroe | B23K 10/00 219/121.52 |
| 2011/0273260 | A1* | 11/2011 | Morrisroe | G01N 21/3103 336/222 |
| 2015/0294842 | A1* | 10/2015 | Nebel | H01J 37/32027 315/111.41 |

* cited by examiner

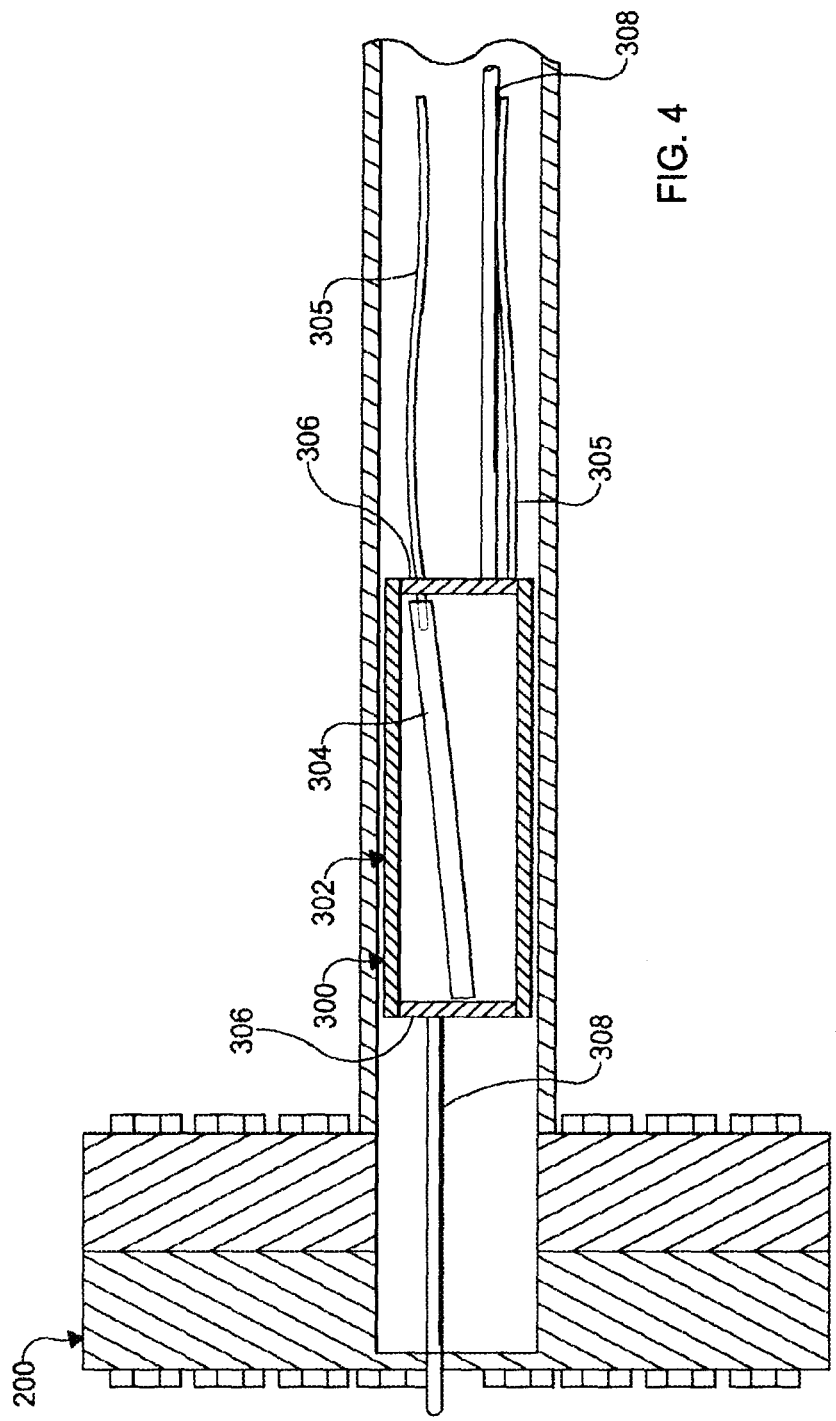

ELECTRICAL TRANSFORMER

CROSS REFERENCE TO RELATED PATENT APPLICATION

This application claims priority to U.S. Patent Application No. 61/730,800 filed Nov. 28, 2012, herein incorporated by reference in its entirety.

BACKGROUND

Alternating current (AC) is typically preferred over direct current (DC) for transmission of electricity over long distances due, at least in part, to the ease of switching (i.e., stepping) voltages and currents with AC power using transformers. Such AC transformers enable long distance transmission. Transmission of DC over the same distances is not easy to do with DC power. Although current solutions provide long distance DC transmission, such solutions are complex and costly. These and other shortcomings are addressed by the present disclosure.

SUMMARY

It is to be understood that both the following summary and the following detailed description are exemplary and explanatory only and are not restrictive, as claimed. Provided are methods and systems for, in one aspect, managing DC power. Provided are methods and systems for, in another aspect, transforming DC power.

In an aspect, systems and methods of the present disclosure transform DC voltages and currents, while minimizing cost and complexity. In another aspect, instead of using wires and iron cores similar to AC transformers, the DC transformer systems of the present disclosure can comprise plasma, helical electrodes, and an axial magnetic field. As an example, the transformation of the DC voltages and currents relies on newly discovered physics, which is based on magnetohydrodynamics (MHD) dynamo behavior.

In an aspect, a system can comprise plasma disposed in a housing and a pair of helical electrodes disposed in the housing, wherein an electric current passing through the pair of electrodes induces a rotation in the plasma.

In an aspect, a system can comprise plasma disposed in a housing and a pair of helical electrodes disposed in the housing, wherein an electric current passing through the pair of electrodes induces a rotation in the plasma. A conductive end cap can be coupled to the housing and the helical electrodes.

In an aspect, a method can comprise generating a magnetic field through a plasma and generating a rotation in the plasma, thereby generating an electric current.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems:

FIG. 4 is a cross-section view of an exemplary transformer system;

DETAILED DESCRIPTION

Figure 1:
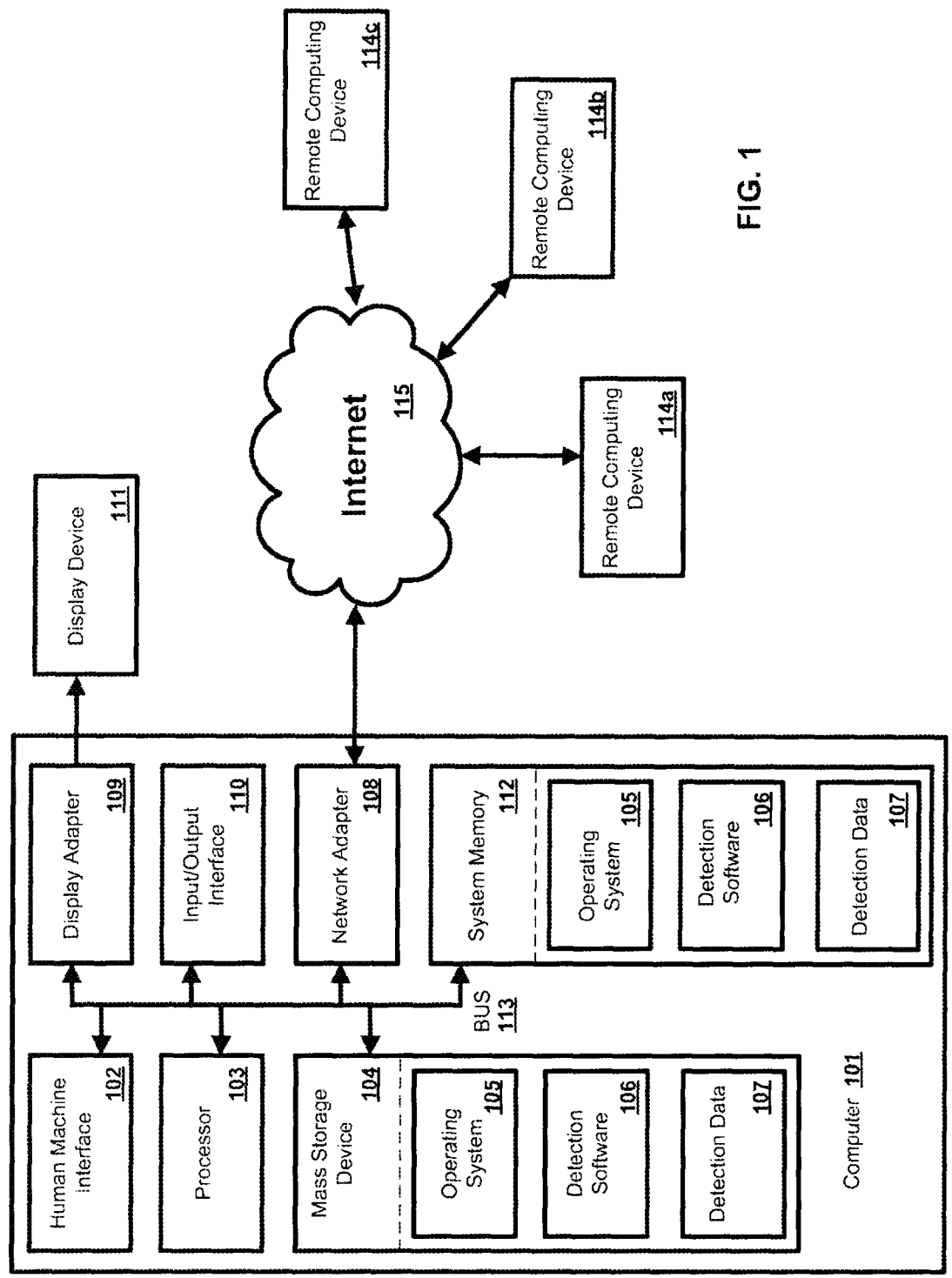
FIG. 1 is a block diagram of an exemplary computing device.

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

In an aspect, the systems and methods of the present disclosure can comprise inducing a flow in plasma. In another aspect, flows can be induced in plasmas by applying an electric field perpendicular to the magnetic field. The ideal MHD Ohm's law can be written as:

$$E + v \times B = 0, \tag{1}$$

where E is the local electric field, v is the local plasma velocity, and B is the local magnetic field. Bold face indicates quantities which are vectors.

If equation (1) is crossed with the magnetic field B, it can be determined that the plasma flow perpendicular to the magnetic field (denoted as $V_{ExB}$ and commonly referred to as the ExB drift velocity) becomes:

$$V_{ExB} = (E \times B)/B^2, \tag{2}$$

where B2 is the vector dot product of B with itself.

In order for the ExB drift velocity to significantly change the magnetic field it must be comparable to the Alfven speed ($V_A$) which can be expressed as:

$$V_A \equiv B/(\mu_0 \rho)^{1/2}, \tag{3}$$

where B is the magnitude of the magnetic field, $\rho$ is the mass per unit volume, and $\mu 0$ is the permittivity of free space. Equation (1) can be combined with Maxwell's field evolution equation:

$$\partial B/\partial t = -\text{curl}(E) \tag{4}$$

and integrated over a surface. As such, the result calculation provides that the magnetic field lines (or the magnetic flux) are substantially frozen into the plasma. As an example, the magnetic field lines convect with the plasma.

In an aspect, when plasma velocities approach the Alfven speed ($V_A$) the plasma velocities can bend the magnetic field lines. Thus, if a velocity shear is induced in the perpendicular velocity (e.g., the $V_{ExB}$ drift velocity) along a magnetic field line, the magnetic field can be significantly modified (provided that the flow speeds are near the Alfven speed ($V_A$).

In an aspect, three-dimensional nonlinear plasma simulations (resistive magnetohydrodynamics (MHD)) can be used to confirm aspects of the phenomenon described herein above. As an example, simulation code similar to that implemented in A. Y. Aydemir, D. C. Barnes, E. J. Caramana, A. A. Mirin, R. A. Nebel, D. D. Schnack, A. G. Sgro, Phys Fluids 28, 898 (1985) and D. D. Schnack, D. C. Barnes, Z. Mikic, D. S. Harned, E. J. Caramana, R. A. Nebel, Computer Phys Comm 43, 17 (1986), can be used. As a further example, plasma can be simulated in cylindrical geometry.

In an aspect, an axial magnetic field can be applied along a helical electric field (e.g., provided via a pair of helical electrodes on the boundary). Such simulation can be plotted as profiles, shown in FIG. 13.

The q value that is plotted is defined as:

$$q \equiv 2\pi r_p B_\theta/(LB_z), \tag{5}$$

where $r_p$ is the radial dimension of the cylinder, L is the Length of the cylinder, $B_\theta$ is the poloidal (or azimuthal) magnetic field, and $B_z$ is the axial magnetic field.

Figure 13:
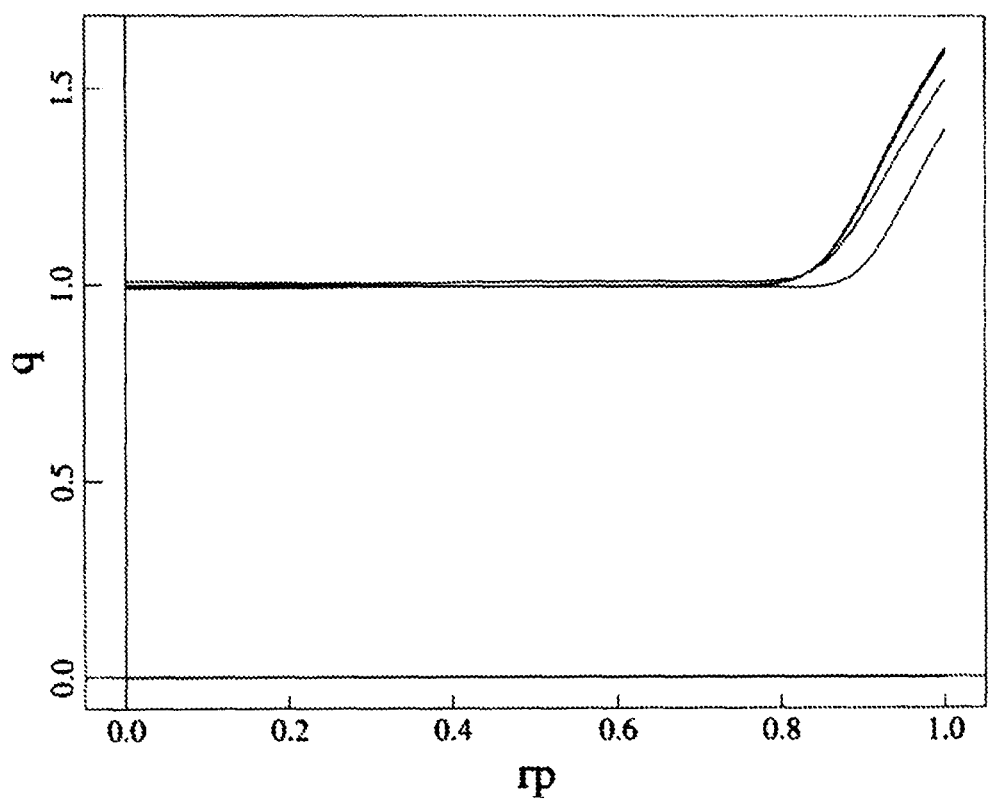
FIG. 13 is a graph plotting profiles of an axial magnetic field applied along a helical electric field.

As illustrated in FIG. 13, the initial conditions indicate no poloidal magnetic field and the axial magnetic field is constant everywhere (i.e., vacuum field conditions). The boundary conditions are that the electrodes undergo a single poloidal revolution as the axial coordinate goes from 0 to L.

As illustrated in FIG. 13, the q=1 state corresponds to the magnetic field aligning itself parallel to the helical electrodes. As an example, q~1 everywhere in the plasma means that all of the magnetic field lines have almost the same helix, which allows them to slip through one another. However, the fact that q is finite means that the helical electrodes are driving an axial current. Large voltage and small current from the electrodes results in a large current with a small voltage parallel to the magnetic field. Such a simulation reflects a voltage step-down DC-DC transformer.

FIG. 1 is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well known computing systems, environments, and/or configurations that can be suitable for use with the systems and methods comprise, but are not limited to, dynamos, personal computers, server computers, laptop devices, and multiprocessor systems. Additional examples comprise set top boxes, programmable consumer electronics, network PCs, minicomputers, mainframe computers, distributed computing environments that comprise any of the above systems or devices, and the like.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

Further, one skilled in the art will appreciate that the systems and methods disclosed herein can be implemented via a general-purpose computing device in the form of a computer 101. The components of the computer 101 can comprise, but are not limited to, one or more processors or processing units 103, a system memory 112, and a system bus 113 that couples various system components including the processor 103 to the system memory 112. In the case of multiple processing units 103, the system can utilize parallel computing.

The system bus 113 represents one or more of several possible types of bus structures, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 113, and all buses specified in this description can also be implemented over a wired or wireless network connection and each of the subsystems, including the processor 103, a mass storage device 104, an operating system 105, simulation software 106, simulation data 107, a network adapter 108, system memory 112, an Input/Output Interface 110, a display adapter 109, a display device 111, and a human machine interface 102, can be contained within one or more remote computing devices 114a,b,c at physically separate locations, connected through buses of this form, in effect implementing a fully distributed system.

The computer 101 typically comprises a variety of computer readable media. Exemplary readable media can be any available media that is accessible by the computer 101 and comprises, for example and not meant to be limiting, both volatile and non-volatile media, removable and non-removable media. The system memory 112 comprises computer readable media in the form of volatile memory, such as random access memory (RAM), and/or non-volatile memory, such as read only memory (ROM). The system memory 112 typically contains data such as simulation data 107 and/or program modules such as operating system 105 and simulation software 106 that are immediately accessible to and/or are presently operated on by the processing unit 103.

In another aspect, the computer 101 can also comprise other removable/non-removable, volatile/non-volatile computer storage media. By way of example, FIG. 1 illustrates a mass storage device 104 which can provide non-volatile storage of computer code, computer readable instructions, data structures, program modules, and other data for the computer 101. For example and not meant to be limiting, a mass storage device 104 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 104, including by way of example, an operating system 105 and simulation software 106. Each of the operating system 105 and simulation software 106 (or some combination thereof) can comprise elements of the programming and the simulation software 106. Simulation data 107 can also be stored on the mass storage device 104. Simulation data 107 can be stored in any of one or more databases known in the art. Examples of such databases comprise, DB2®, Microsoft® Access, Microsoft® SQL Server, Oracle®, mySQL, PostgreSQL, and the like. The databases can be centralized or distributed across multiple systems.

In another aspect, the user can enter commands and information into the computer 101 via an input device (not shown). Examples of such input devices comprise, but are not limited to, a keyboard, pointing device (e.g., a "mouse"), a microphone, a joystick, a scanner, tactile input devices such as gloves, and other body coverings, and the like These and other input devices can be connected to the processing unit 103 via a human machine interface 102 that is coupled to the system bus 113, but can be connected by other interface and bus structures, such as a parallel port, game port, an IEEE 1394 Port (also known as a Firewire port), a serial port, or a universal serial bus (USB).

In yet another aspect, a display device 111 can also be connected to the system bus 113 via an interface, such as a display adapter 109. It is contemplated that the computer 101 can have more than one display adapter 109 and the computer 101 can have more than one display device 111. For example, a display device can be a monitor, an LCD (Liquid Crystal Display), or a projector. In addition to the display device 111, other output peripheral devices can comprise components such as speakers (not shown) and a printer (not shown) which can be connected to the computer 101 via Input/Output Interface 110. Any step and/or result of the methods can be output in any form to an output device. Such output can be any form of visual representation, including, but not limited to, textual, graphical, animation, audio, tactile, and the like.

The computer 101 can operate in a networked environment using logical connections to one or more remote computing devices 114a,b,c. By way of example, a remote computing device can be a personal computer, portable computer, a server, a router, a network computer, a peer device or other common network node, and so on. Logical connections between the computer 101 and a remote computing device 114a,b,c can be made via a local area network (LAN) and a general wide area network (WAN). Such network connections can be through a network adapter 108. A network adapter 108 can be implemented in both wired and wireless environments. Such networking environments are conventional and commonplace in offices, enterprise-wide computer networks, intranets, and the Internet 115.

For purposes of illustration, application programs and other executable program components such as the operating system 105 are illustrated herein as discrete blocks, although it is recognized that such programs and components reside at various times in different storage components of the computing device 101, and are executed by the data processor(s) of the computer. An implementation of simulation software 106 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

Figure 2:
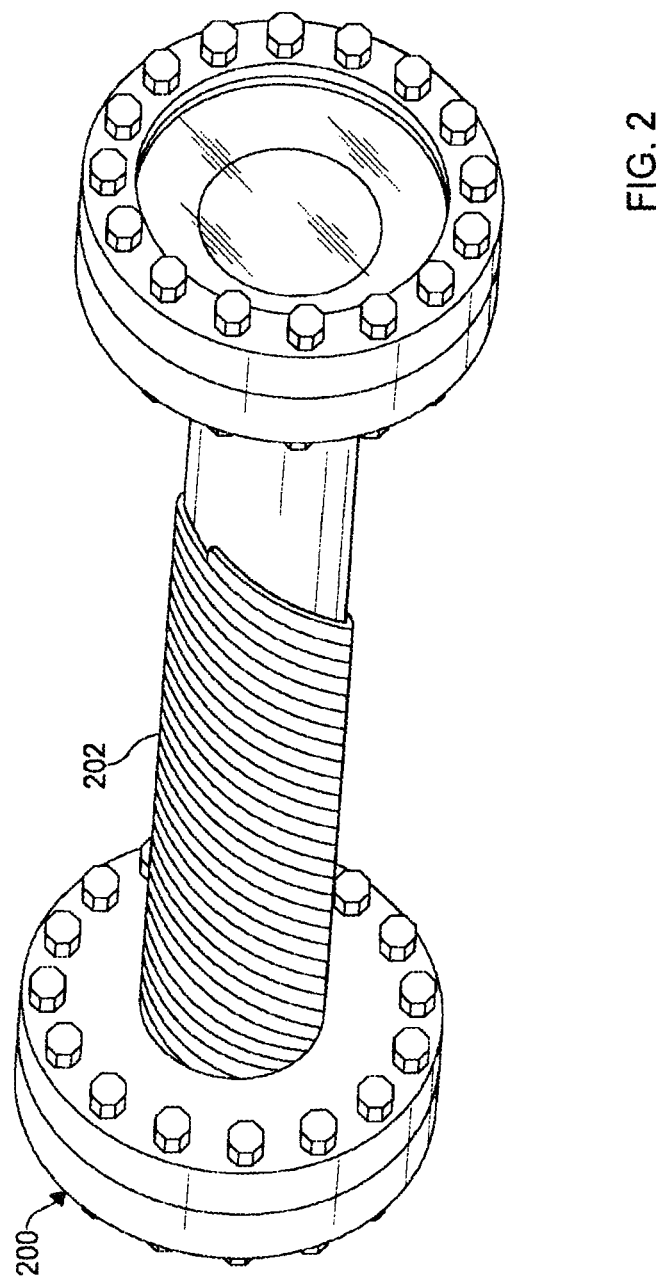
FIG. 2 is a perspective view of an exemplary transformer system.

FIG. 2 illustrates a cylindrical vacuum chamber 200 of a transformer system. In an aspect, plasma (not shown) can be disposed in the chamber 200. As an example, a conductor 202 (e.g., wire) can be disposed around a periphery of the housing forming the chamber 200. As a further example, wire can be wound about the chamber 200 to define a solenoid that provides an axial magnetic field.

Figure 3A:
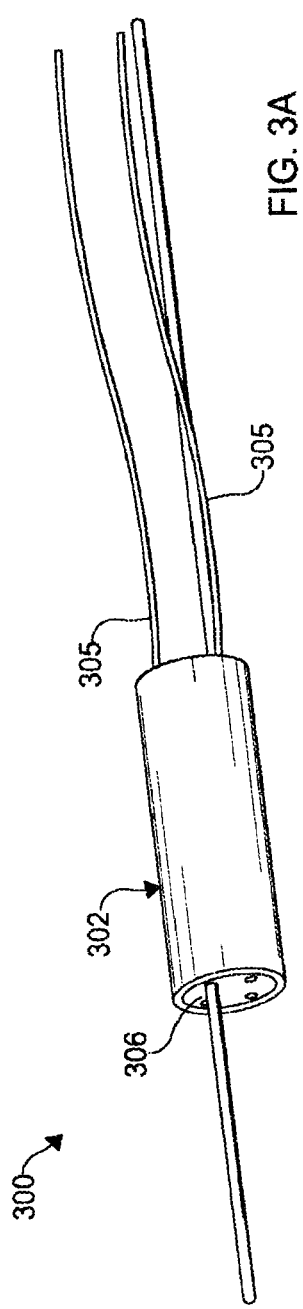
FIG. 3A is a perspective view of an exemplary transformer assembly.
Figure 3B:
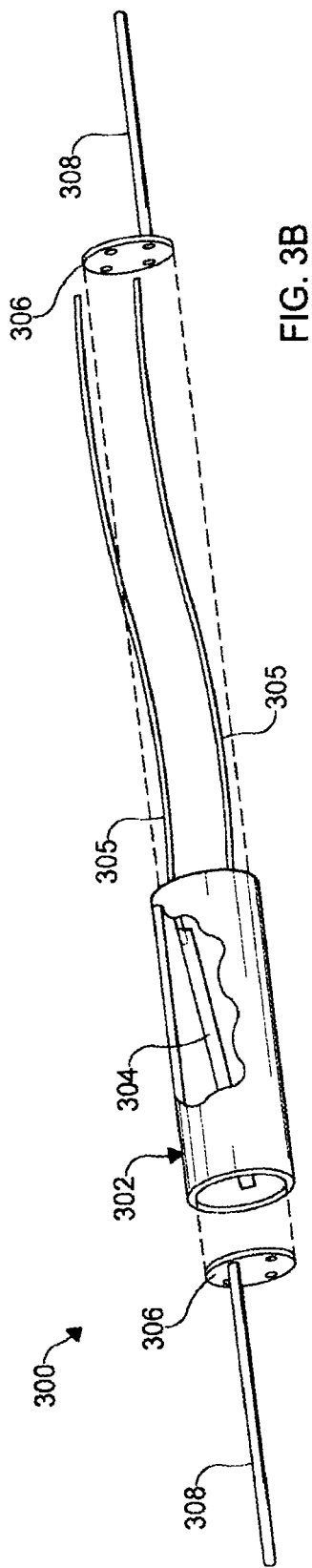
FIG. 3B is an exploded perspective view of an exemplary transformer assembly.

FIGS. 3A-3B illustrate a transformer assembly 300. In an aspect, the transformer assembly comprises a housing 302 having one or more electrodes 304 disposed therein and/or extending therefrom. As an example, the electrodes 304 can be disposed in the chamber 200 of FIG. 2. As shown, the electrodes 304 are helically wound and have a 10:1 twist (e.g., the electrodes travel 10 times as far in the axial direction as they do in the poloidal (azimuthal direction)). Other twists can be used and ratios can be used. As an example, twists can range from about 1:50 to about 1:1 axial to poloidal ratio. In an aspect, the electrodes 304 serve as the primary for the transformer system. As an example, high voltage and low current can be is applied across the electrodes 304, for example, via leads 305. Accordingly, the applied electric field is perpendicular to the applied magnetic field from conductor 202.

In an aspect, the electrodes 304 induce rotation in the plasma via the ExB drift. Since the electrodes 304 are helical, this rotation is sheared in the axial direction. The result is that the field lines are bent and an axial current is induced.

As an example, the housing 302 can be formed from ceramic or electrical insulators such as plastic or composite materials. As a further example, end caps 306 can be disposed at opposite ends of the housing 302. In an aspect, the end caps 306 form the secondary of the transformer. In another aspect, the end caps 306 are conductive and can capture the low voltage and high current that is generated parallel to the magnetic field.

FIG. 4 illustrates a transformer system comprising one or more components illustrated in FIG. 2 and FIGS. 3A-3B. In an aspect, the transformer assembly 300 of FIGS. 3A-3B can be disposed in the vacuum chamber 200 of FIG. 2. In another aspect, the helical electrodes 304 are powered by an electric current. A conductor carries the current from the end caps 306 and constitutes the secondary of the transformer. One or more terminals 308 can be coupled to the end caps 306 to allow the secondary current to be transmitted.

Figure 5:
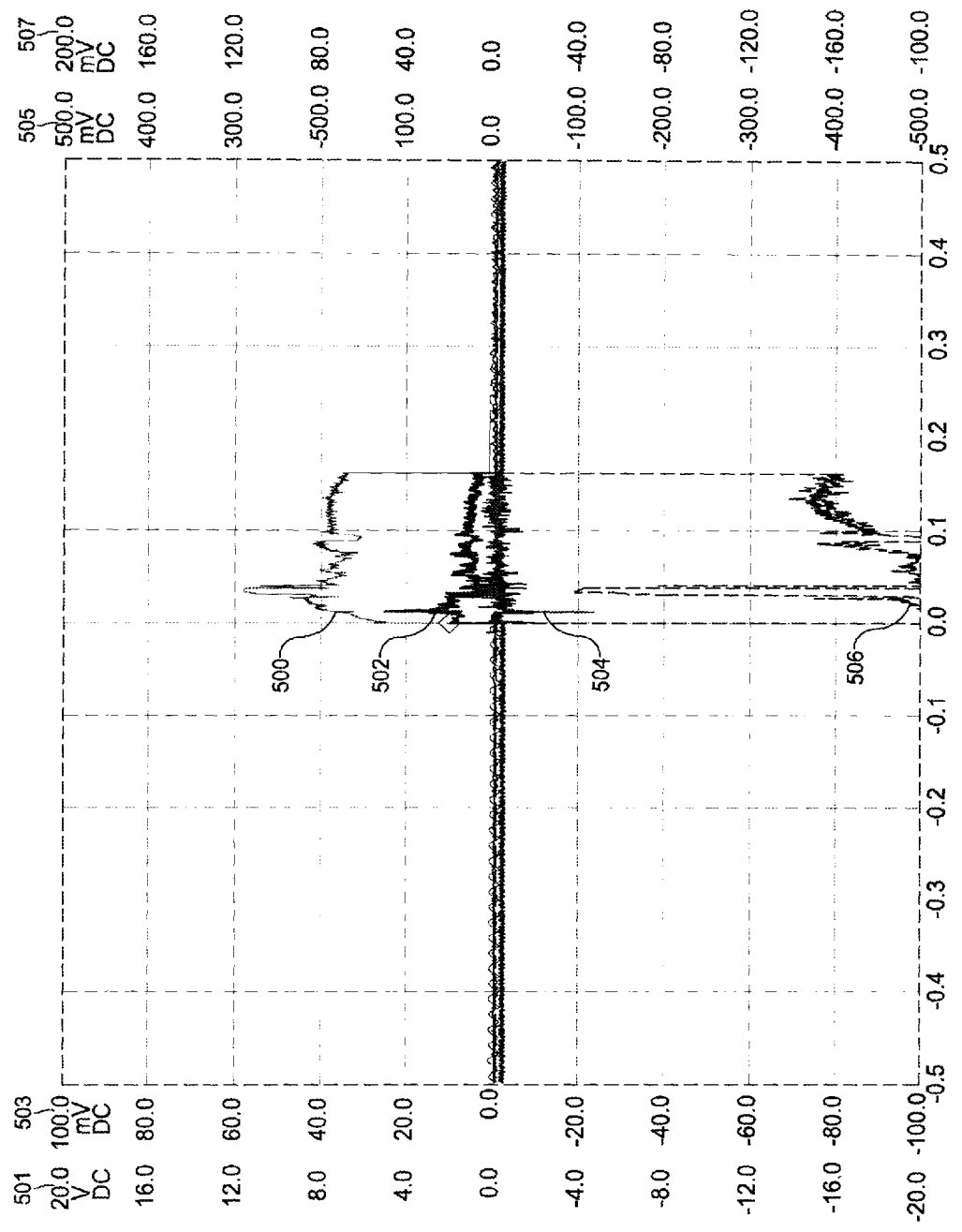
FIG. 5 illustrates oscilloscope traces demonstrating a DC-DC voltage stepdown transformer.

FIG. 5 illustrates oscilloscope curves that demonstrate the stepdown transformer performance of the transformer system illustrated in FIG. 4. As shown, a first curve 500 represents the input voltage on the primary. The input voltage is about 80 Volts and the first curve 500 reads as 8 Volts along the first scale 501. A second curve 502 represents a measured current on a primary side of the transformer system. The measured current is about 400 mA which corresponds to a 4 mV along the second scale 503. A third curve 504 represents an induced voltage on a secondary side of the transformer system. The induced voltage is about 40 mV which corresponds to 4 mV along a third scale 505. A fourth curve 506 represents a current in the secondary of the transformer system. The current in the secondary is about 40 A which corresponds to 400 mV along a fourth scale 507. As illustrated, the curves 500, 502, 504, 506 demonstrate a stepped up the current in the secondary a factor of about 100 times the applied current in the primary.

Figure 6:
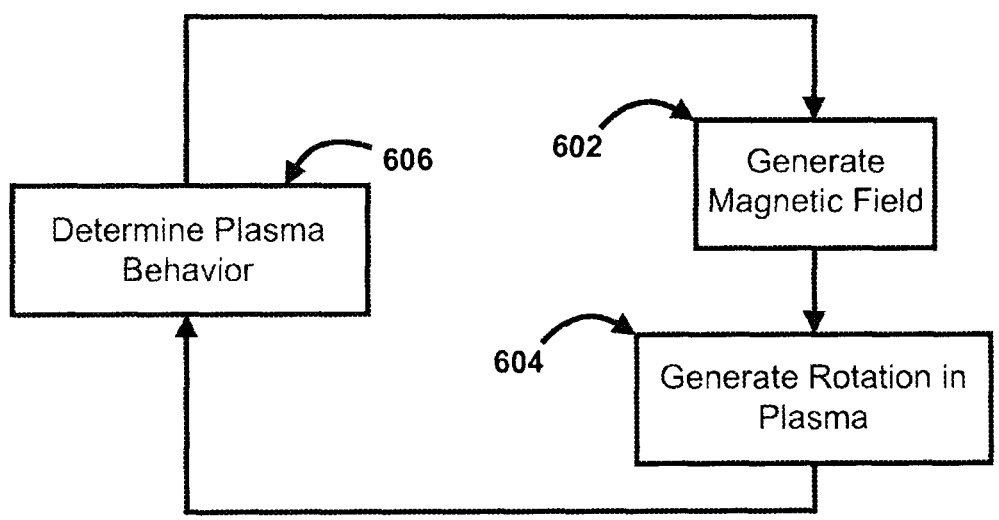
FIG. 6 is a flow diagram of an exemplary method.

In an aspect, as shown in FIG. 6 a method can comprise generating a magnetic field through a plasma (step 602) and generating a rotation in the plasma (step 604), thereby generating an electric current. The magnetic field can be generated by a solenoid assembly. As an example, solenoid assembly can be disposed around the plasma, such as a solenoid housing. In an aspect, the rotation can be sheared in an axial direction relative to the plasma and the current is generated in the axial direction. In an aspect, a drift speed of the plasma is a factor (e.g., fraction or multiple) of the Alfven Speed. As an example, the drift speed of the plasma can be between about 0.5 and about 400 times the Alfven speed. As a further example, the drift speed can be between about 0.5 and about 2 times the Alfven speed, between about 0.5 and about 10 times the Alfven speed, between about 0.5 and about 100 times the Alfven speed, between about 0.5 and about 200 times, or between about 0.5 and about 300 times the Alfven speed. Other ranges of factors can result from the systems and methods of the present disclosure. In another aspect, generating a rotation in the plasma comprises generating one or more of a partial laminar flow and a turbulent flow in the plasma. In a further aspect, plasma behavior can be determined (e.g., estimated, simulated) using an MHD simulation (step 606). Accordingly, the magnetic field and rotation generated can be configured based on the MHD simulation.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the scope of the methods and systems. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Figure 7:
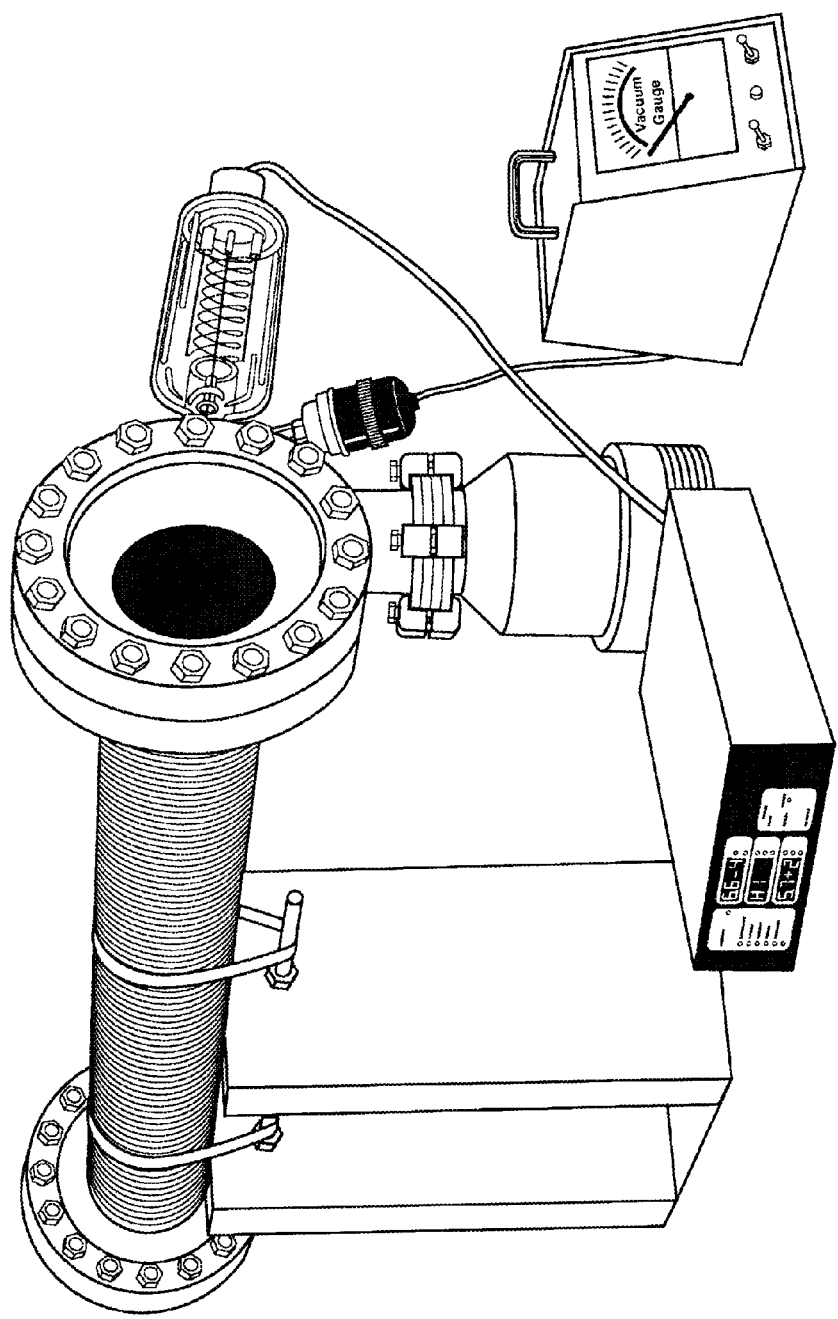
FIG. 7 is an illustration of an exemplary vacuum chamber.

FIG. 7 illustrates a cylindrical vacuum chamber. In an aspect, plasma can be disposed in the chamber. As an example, a conductor (e.g., wire) can be disposed around a periphery of the housing forming the chamber. As a further example, wire can be wound about the chamber to define a solenoid that provides an axial magnetic field.

Figure 8:
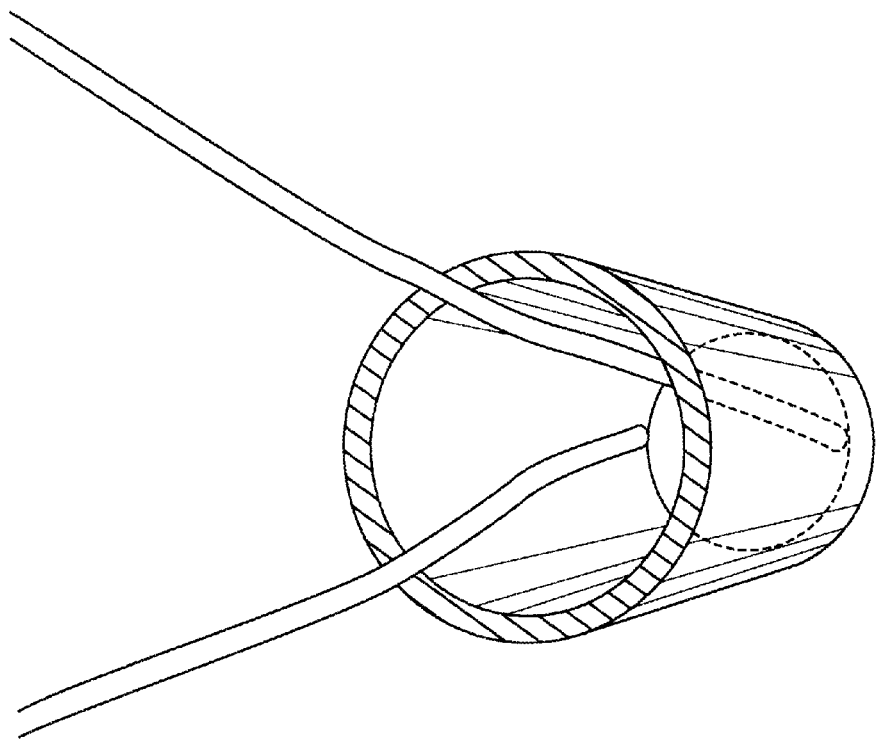
FIG. 8 is an illustration of an exemplary transformer assembly.

FIG. 8 illustrates a transformer assembly comprising helical electrodes. The electrodes can be disposed in the chamber of FIG. 7. As shown, the electrodes have a 10:1 twist (e.g., the electrodes travel 10 times as far in the axial direction as they do in the poloidal (azimuthal direction)). Other twists can be used and ratios can be used. As an example, twists can range from about 1:50 to about 1:1 axial to poloidal ratio. In an aspect, the helical electrodes serve as the primary for the transformer system. As an example, high voltage and low current can be is applied across the electrodes. Accordingly, the applied electric field is perpendicular to the applied magnetic field.

In an aspect, the electrodes induce a plasma rotation via the ExB drift. Since the electrodes are helical, this rotation is sheared in the axial direction. The result is that the field lines are bent and an axial current is induced.

Figure 9:
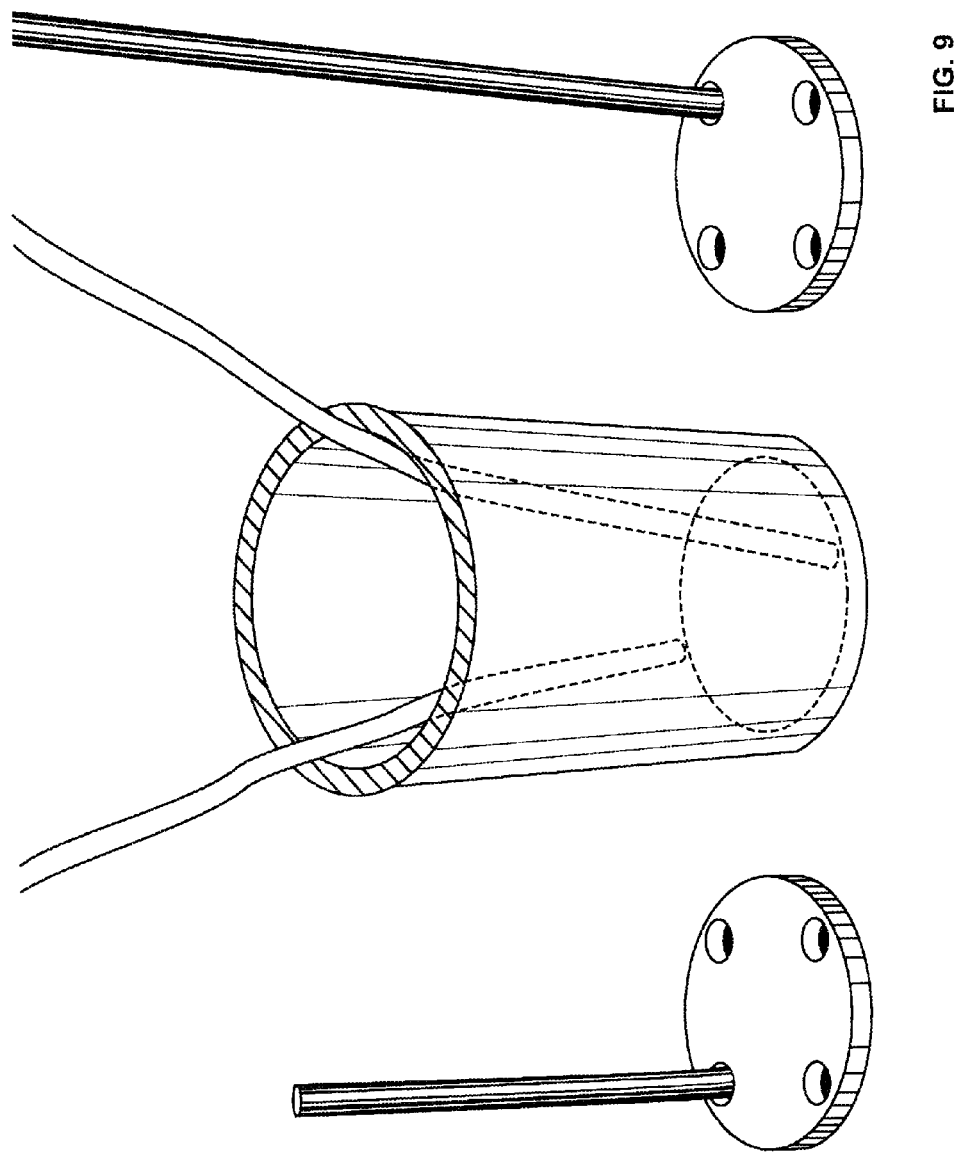
FIG. 9 is an illustration of an exemplary transformer system.
Figure 10:
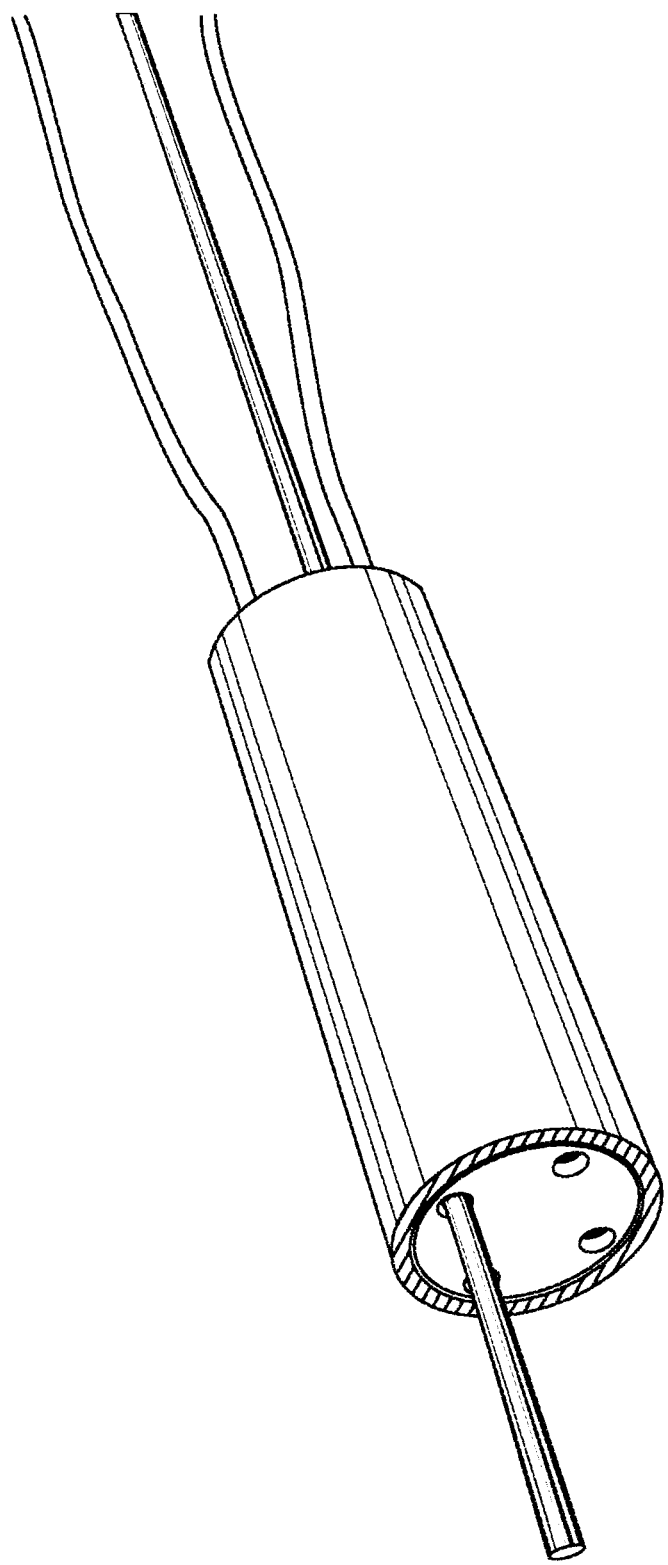
FIG. 10 is illustration of an exemplary transformer system.

FIGS. 9-10 illustrate an exemplary transformer assembly or system. In an aspect, the helical electrodes can be disposed in a housing. As an example, the housing can be formed from ceramic or electrical insulators such as plastic or composite materials. As a further example, end caps can be disposed at opposite ends of the housing. In an aspect, the end caps form the secondary of the transformer. In another aspect, the end caps are conductive and can capture the low voltage and high current that is generated parallel to the magnetic field.

Figure 11:
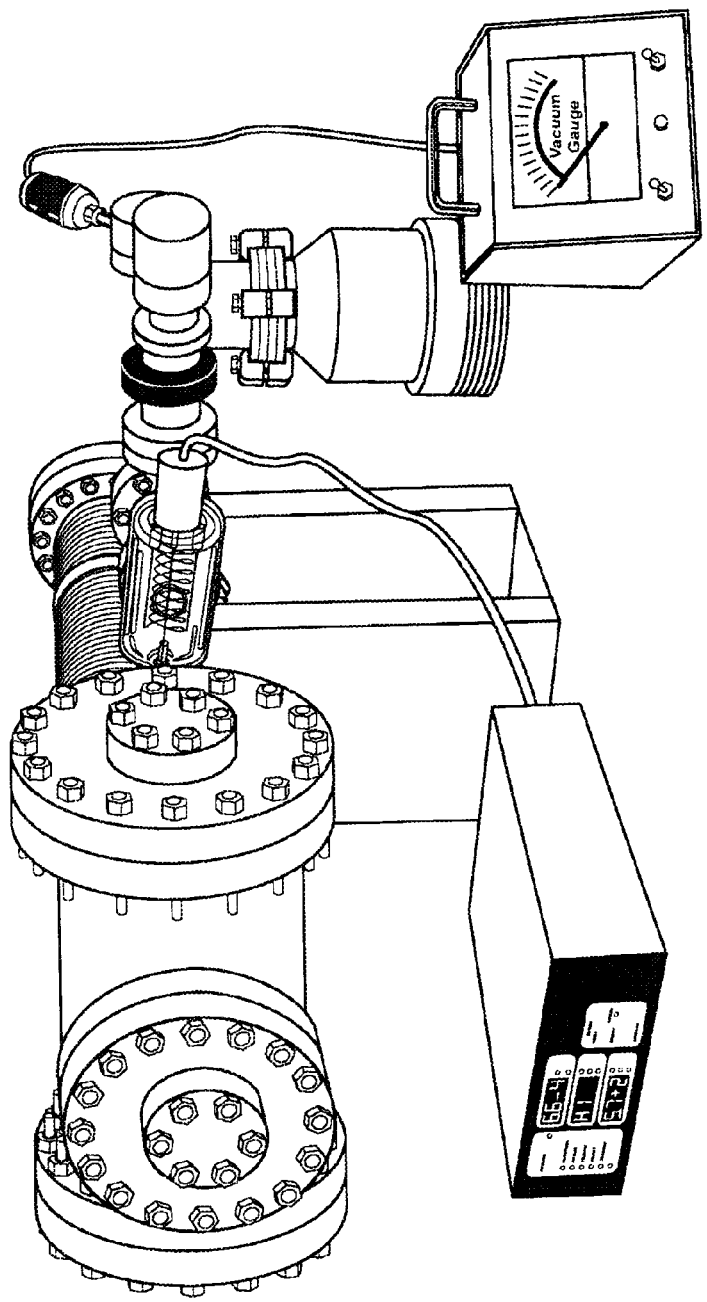
FIG. 11 is an illustration of an exemplary transformer system.
Figure 12:
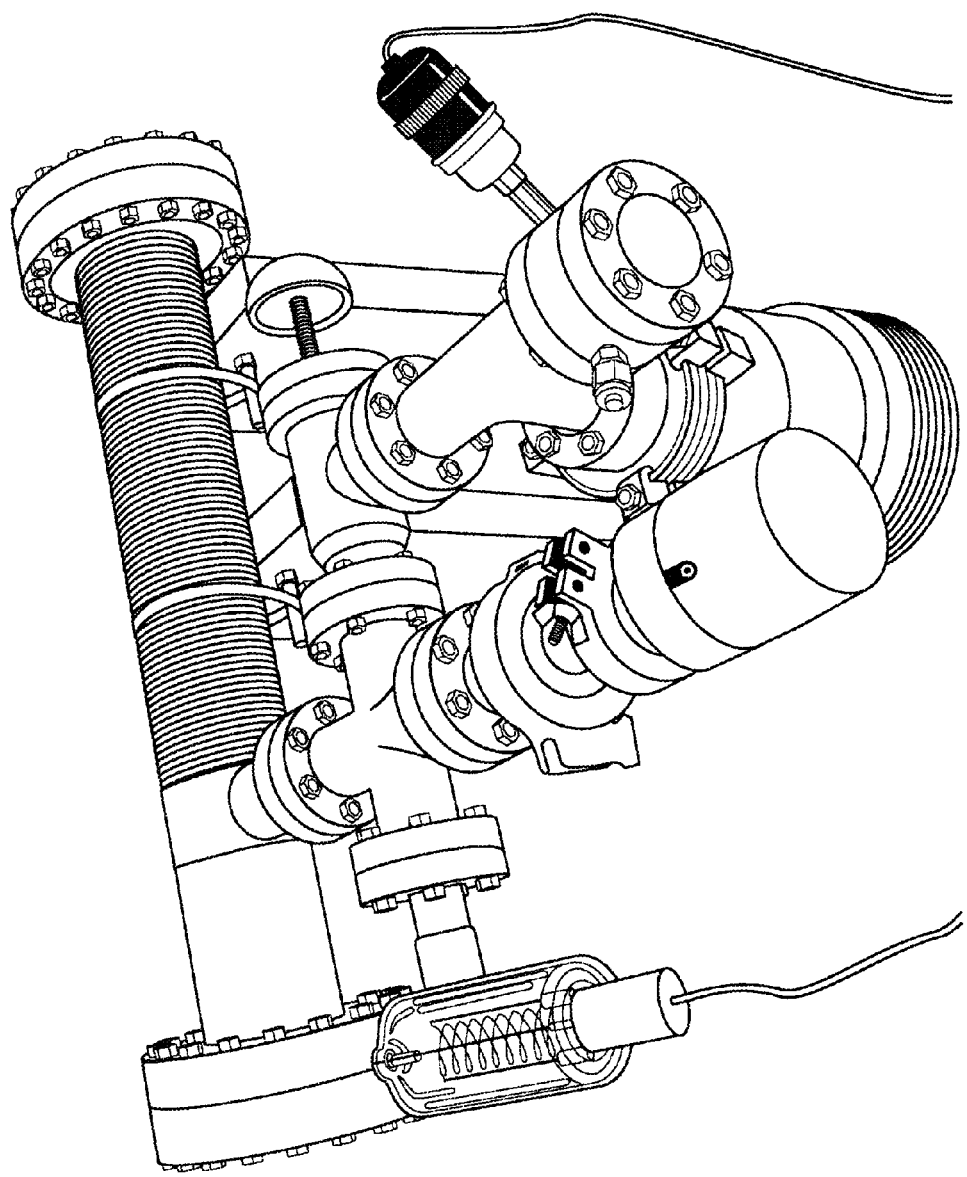
FIG. 12 is an illustration of an exemplary transformer system.

FIGS. 11-12 illustrate the transformer system. In an aspect, the helical electrodes are powered by the two smaller wires extending from the ceramic housing. A conductor carries the current from the end caps and constitutes the secondary of the transformer. Terminals can be coupled to the end cap to allow the secondary current to be transmitted. As illustrated in FIGS. 11-12, the transformer assembly of FIGS. 8-10 can be disposed in the vacuum chamber of FIG. 7.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications are referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A system comprising:
   plasma disposed in a housing; and
   a pair of helical electrodes disposed in the housing, wherein an electric current passing through the pair of electrodes induces a rotation in the plasma.

2. The system of claim 1, further comprising a conductive material disposed around a periphery of the housing, wherein an electric current passing through the conductive material induces an axial magnetic field in a cavity of the housing.

3. The system of claim 1, wherein the helical electrodes have a twist whereby the electrodes travel farther in the axial direction than the poloidal over a length of the electrodes.

4. The system of claim 1, wherein the induced rotation comprises a turbulent flow in the plasma.

5. The system of claim 1, wherein the induced rotation comprises a laminar flow in the plasma.

6. A system comprising:
   plasma disposed in a housing;
   a pair of helical electrodes disposed in the housing, wherein an electric current passing through the pair of electrodes induces a rotation in the plasma; and
   a conductive end cap coupled to the housing and the helical electrodes.

7. The system of claim 6, further comprising a conductive material disposed around a periphery of the housing, wherein an electric current passing through the conductive material induces an axial magnetic field in a cavity of the housing.

8. The system of claim 6, wherein the helical electrodes have a twist whereby the electrodes travel farther in the axial direction than the poloidal over a length of the electrodes.

9. The system of claim 6, wherein the electrodes serve as a primary of a plasma electrical transformer and the end cap serves as a secondary of the plasma electrical transformer.

10. The system of claim 6, wherein the induced rotation comprises a turbulent flow in the plasma.

11. The system of claim 6, wherein the induced rotation comprises a laminar flow in the plasma.

12. A method comprising:
generating a magnetic field through a plasma; and
generating, by passing electric current through electrodes adjacent the plasma, a rotation in the plasma, thereby generating an electric current.

13. The method of claim 12, wherein the magnetic field is generated by a solenoid assembly.

14. The method of claim 13, wherein the solenoid assembly is disposed around the plasma.

15. The method of claim 12, wherein the rotation is sheared in an axial direction relative to the plasma and the current is generated in the axial direction.

16. The method of claim 12, wherein a drift speed of the plasma is between about 0.5 and about 400 times the Alfven Speed.

17. The method of claim 12, further comprising determining plasma behavior using an MHD simulation.

18. The method of claim 12, wherein generating a rotation in the plasma comprises generating turbulent flow in the plasma.

19. The method of claim 12, wherein generating a rotation in the plasma comprises generating at least a partial laminar flow in the plasma.

* * * * *